(12) United States Patent
Noh et al.

(10) Patent No.: US 7,859,186 B2
(45) Date of Patent: Dec. 28, 2010

(54) WHITE ORGANIC LIGHT EMITTING DEVICE

(75) Inventors: Tae-yong Noh, Yongin-si (KR);
Shinichiro Tamura, Yongin-si (KR);
Byoung-ki Choi, Yongin-si (KR);
Myeong-suk Kim, Yongin-si (KR);
Yu-jin Kim, Yongin-si (KR); Eun-sil Han, Yongin-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 192 days.

(21) Appl. No.: 12/073,273

(22) Filed: Mar. 3, 2008

(65) Prior Publication Data
US 2008/0297036 A1   Dec. 4, 2008

(30) Foreign Application Priority Data
May 31, 2007   (KR) .................... 10-2007-0053472

(51) Int. Cl.
*H01J 1/62* (2006.01)

(52) U.S. Cl. .................. 313/504; 313/500; 313/501; 313/503; 313/505; 313/506

(58) Field of Classification Search ......... 313/500–512, 313/484–487, 489, 468; 257/98–100, 79–81; 362/235, 227, 231, 293, 545, 800; 345/44, 345/46; 438/22, 26, 458
See application file for complete search history.

(56) References Cited
FOREIGN PATENT DOCUMENTS
EP   1718120 A2 * 11/2006
EP   1755362 A1 *  2/2007

* cited by examiner

*Primary Examiner*—Bumsuk Won
*Assistant Examiner*—Elmito Breval
(74) *Attorney, Agent, or Firm*—Robert E. Bushnell, Esq.

(57) ABSTRACT

A white organic light emitting device includes an anode, a cathode, a charge generation layer arranged between the anode and the cathode and an organic layer arrangement arranged between the anode and the cathode, the organic layer arrangement including a green light emitting layer, a blue light emitting layer, and a red light emitting layer, one of the green light emitting layer, the blue light emitting layer, and the red light emitting layer includes a first light emitting layer and second light emitting layer, the charge generation layer being arranged between the first light emitting layer and the second light emitting layer.

25 Claims, 4 Drawing Sheets

WHITE ORGANIC LIGHT EMITTING DEVICE

CLAIM OF PRIORITY

This application makes reference to, incorporates the same herein, and claims all benefits accruing under 35 U.S.C. §119 from an application for WHITE ORGANIC LIGHT EMITTING DEVICE, earlier filed in the Korean Intellectual Property Office on 31 May 2007 and there duly assigned Serial No. 10-2007-0053472.

BACKGROUND OF THE INVENTION

1. Field of the Invention

The present invention relates to a display device, and more particularly, to a white organic light emitting device having high light emission efficiency.

2. Description of the Related Art

Organic light emitting devices (OLEDs) are self emissive display devices that use light generated by combining electrons and holes supplied to a fluorescence or phosphorescence organic compound thin film (hereinafter, an organic thin film). Generally, an OLED has a structure in which an anode, a hole transporting layer, a light emitting layer, an electron transporting layer, and a cathode are sequentially formed on a substrate.

A white OLED emits white light, and can be used as a paper-thin light source, a backlight for a liquid crystal display device, or a full color display device that employs a color filter. Approaches to manufacturing white OLEDs can be largely classified into two methods. The first method is making a light emitting layer as a single layer (hereinafter, the first method) and the second method is dividing the light emitting layer into multiple layers (hereinafter, the second method).

The first method includes a method of doping red, green, and blue dopants in one host, and a method of doping red and green dopants in a blue host. However, the light emitting layer formed using the first method has reduced light emission efficiency since energy transfer to the dopants is difficult.

In the second method, a light emitting layer can be configured by stacking a red light emitting layer, a green light emitting layer, and a blue light emitting layer. However, this produces a light emitting layer with low light emission efficiency due to a large current applied to the light emitting layer. Further, it is difficult to obtain three uniform primary colors due to excessive energy transfer within the light emitting layer.

SUMMARY OF THE INVENTION

To solve the above and/or other problems, the present invention provides a white OLED having a low driving current and high light emission efficiency.

According to an aspect of the present invention, there is provided a white organic light emitting device that includes an anode, a cathode, a charge generation layer arranged between the anode and the cathode and an organic layer arrangement arranged between the anode and the cathode, the organic layer arrangement including a green light emitting layer, a blue light emitting layer, and a red light emitting layer, one of the green light emitting layer, the blue light emitting layer, and the red light emitting layer includes a first light emitting layer and second light emitting layer, the charge generation layer being arranged between the first light emitting layer and the second light emitting layer.

Other ones of the green light emitting layer, the blue light emitting layer, and the red light emitting layer can include single light emitting layers, and wherein the single light emitting layers can be separated by the charge generation layer. Other ones of the green light emitting layer, the blue light emitting layer, and the red light emitting layer can include single light emitting layers, and a sum of currents applied to the first and second light emitting layers can be greater than a current applied to each of the single light emitting layers upon application of current to the organic layer arrangement upon application of a voltage between the anode and the cathode. The white organic light emitting device can also include a first electron transport layer arranged between a layer of said organic layer arrangement and the charge generation layer, the first electron transport layer also being arranged between the anode and the charge generation layer.

The white organic light emitting device can also include an electron injection layer arranged between the charge generation layer and the first electron transport layer. The white organic light emitting device can also include a hole transport layer arranged between a layer of said organic layer arrangement and the charge generation layer, the hole transport layer also being arranged between the cathode and the charge generation layer. The white organic light emitting device can also include a hole injection layer arranged between the hole transport layer and the charge generation layer.

The charge generation layer can include at least one of an organic compound of aryl amine group, a metal, a metal quinolate, a metal oxide, a metal carbonate, and a metal fluoride. The charge generation layer can include at least one layer. The organic compound of the aryl amine group can be one of α-NPD, BCP, 2-TNATA, TDATA, m-MTDATA, spiro-TAD, and sprio-NPB. The metal can be one of Cs, Mo, V, Ti, W, Ba, and Li. The metal quinolate can include lithium quinolate (Liq). The metal oxide can be one of $Re_2O_7$, $MoO_3$, $V_2O_5$, $WO_3$, $TiO_2$, and $Cs_2CO_3$. The metal carbonate can be $Cs_2CO_3$. The metal fluoride can be one of BaF, LiF, and CsF.

The white organic light emitting device can also include a hole transport layer arranged between the anode and the organic layer arrangement. The white organic light emitting device can also include a hole injection layer arranged between the anode and the hole transport layer. The white organic light emitting device can also include an electron transport layer arranged between the cathode and the organic layer arrangement. The white organic light emitting device can also include an electron injection layer arranged between the cathode and the electron transport layer.

Each of the green light emitting layer, the blue light emitting layer, and the red light emitting layer can include a host and a dopant being one of a fluorescent dopant and a phosphorescent dopant. The green light emitting layer can include $Alq_3$ as the host and Coumarin6 as a dopant. The blue light emitting layer can include TBADN as the host and DPAVBi as the dopant. The red light emitting layer can include $Alq_3$ as the host and DCJTB as the dopant. The green light emitting layer, the blue light emitting layer, and the red light emitting layer can be sequentially arranged on the anode. The one of the green light emitting layer, the blue light emitting layer, and the red light emitting layer can be the blue light emitting layer.

In the present patent application, it is to be understood that:

α-NPD: N,N'-di(naphthalen-1-yl)-N,N'-diphenyl-benzidine

BCP: 2,9-Dimethyl-4,7-diphenyl-1,10-phenanhro-line

2-TNATA: 4,4',4"-tris(N-(2-naphthyl)-N-phenylamino)-triphenylamine

TDATA: 4,4',4"-tris(N,N-diphenyl-amino)-triphenylamine m-MTDATA: 4,4',4"-tris(N-3-methylphenyl-N-phenylamino)-triphenylamine spiro-TAD: N,N'-bis-(3-phenyl)-benzidine-spiro sprio-NPB: N,N'-di(naphthalen-1-yl)-N,N'-diphenyl-spiro The metal can be one selected from the group consisting of Cs, Mo, V, Ti, W, Ba, and Li The metal quinolate can be a lithium quinolate (Liq) such as $LiNOC_9H_9$.

$Alq_3$: Tris-(8-hydroxy-quinolinato)-aluminium coumarin6: 3-(2-benzothiazolyl)-7-(diethylamino)coumarin TBADN: 2-tert-butyl-9,10-bis-(β-naphthyl)-anthracene DPAVBi: 4,4'-Bis[4-(di-p-tolylamino)styryl]biphenyl DCJTB: 4-(dicyanomethylene)-2-t-butyl-6-(1,1,7,7-tetramethyljulolidyl-9-enyl)-4H-pyran The anode can be made out of indium tin oxide (ITO), indium zinc oxide (IZO), $SnO_2$, or ZnO.

The hole transport layers can comprise at least one selected from the group consisting of an oxadiazole compound having an amino substituent, a triphenylmethane compound having an amino substituent, a tertiary compound, a hydazone compound, a pyrazoline compound, an enamine compound, a styryl compound, a stilbene compound, and a carbazole compound.

The electron transport layers can comprise at least one selected from the group consisting of an anthracene compound, a phenanthracene compound, a pyrene compound, a perylene compound, a chrysene compound, a triphenylene compound, a fluoranthene compound, a periflanthene compound, an azole compound, a diazole compound, and a vinylene compound.

The cathode can be made out of a material selected from the group consisting Al, Li, Mg, Ca, Al—Li, Mg—In, Mg—Ag, ITO, and IZO.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
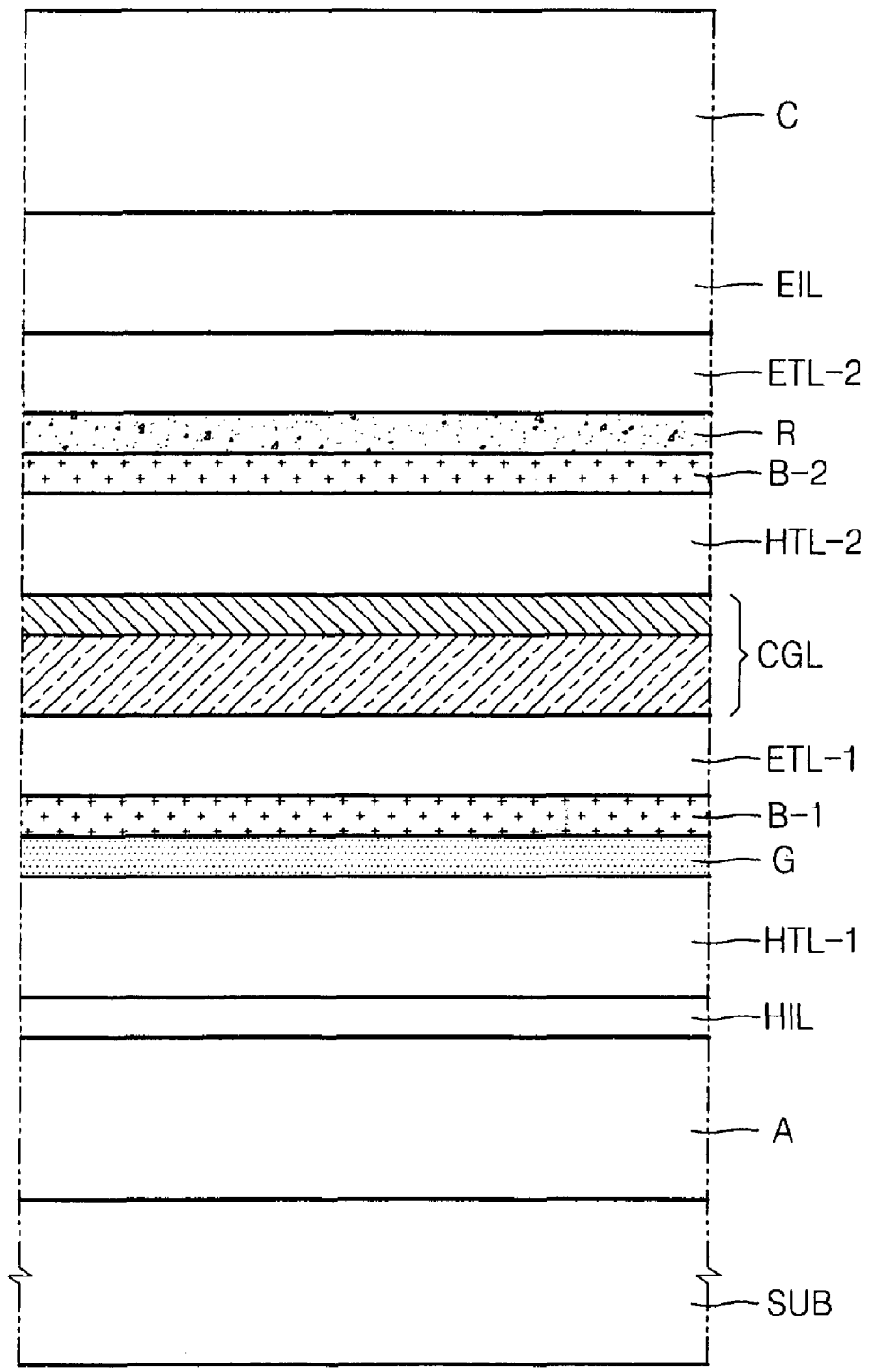
FIG. 1 is a cross-sectional view of a white organic light emitting device (OLED) according to an embodiment of the present invention.

FIG. 1 is a cross-sectional view of a white organic light emitting device (OLED) according to an embodiment of the present invention. Referring to FIG. 1, an anode A is formed on a transparent substrate SUB. The transparent substrate SUB can have a thickness of approximately 0.7 mm. The anode A can be an indium tin oxide (ITO) layer and can have a thickness of approximately 90 nm. The anode A can also be made out of a material other than the ITO, such as indium zinc oxide (IZO), $SnO_2$, or ZnO. Surfaces of the anode A and the transparent substrate SUB are washed with a neutral detergent, de-ionized (DI) water, and isopropyl alcohol (IPA), and treated with ultraviolet rays and ozone.

A hole injection layer (HIL) is formed on the anode A. The hole injection layer HIL can be a $MoO_3$ layer and can have a thickness of approximately 10 nm. The hole injection layer HIL is optional.

A first hole transport layer HTL-1 is formed on the hole injection layer HIL. The first hole transport layer HTL-1 can be a α-NDP layer and can have a thickness of approximately 30 nm. The first hole transport layer HTL-1 can include at least one of an oxadiazole compound having an amino substituent, a triphenylmethane compound having an amino substituent, a tertiary compound, a hydazone compound, a pyrazoline compound, an enamine compound, a styryl compound, a stilbene compound, and a carbazole compound.

A green light emitting layer G is formed on the first hole transport layer HTL-1. The green light emitting layer G can have a thickness of approximately 10 nm, and can include $Alq_3$ as an organic host and coumarin6 as a light emitting dopant. The content of coumarin6 in the green light emitting layer G can be 2 wt %. A first blue light emitting layer B-1 is formed on the green light emitting layer G. The first blue light emitting layer B-1 can have a thickness of approximately 10 nm, and can include TBADN as an organic host and DPAVBi as a light emitting dopant. The content of DPAVBi in the first blue light emitting layer B-1 can be approximately 5 wt %. A first electron transport layer ETL-1 is formed on the first blue light emitting layer B-1. The first electron transport layer ETL-1 can be an $Alq_3$ layer and can have a thickness of approximately 20 nm. The first electron transport layer ETL-1 can include at least one of an anthracene compound, a phenanthracene compound, a pyrene compound, a perylene compound, a chrysene compound, a triphenylene compound, a fluoranthene compound, a periflanthene compound, an azole compound, a diazole compound, and a vinylene compound.

A charge generation layer CGL is formed on the first electron transport layer ETL-1. The charge generation layer CGL can include a first layer and a second layer. The first layer can be a BCP layer that includes $Cs_2CO_3$, and the second layer can be a $MoO_3$ layer. The BCP layer that includes $CS_2CO_3$ can have a thickness of approximately 20 nm, and the $MoO_3$ can have a thickness of approximately 10 nm.

The configuration of the charge generation layer CGL is not limited to the present embodiment. That is, the charge generation layer CGL can include at least one of an organic compound of aryl amine group, a metal, a metal quinolate, a metal oxide, a metal carbonate, and a metal fluoride, and can have a single layer or multiple layer structure. The organic compound of the aryl amine group can be one of α-NPD, BCP, 2-TNATA, TDATA, m-MTDATA, spiro-TAD, and sprio-NPB. The metal can be one of Cs, Mo, V, Ti, W, Ba, and Li. The metal oxide can be one of $Re_2O_7$, $MoO_3$, $V_2O_5$, $WO_3$, $TiO_2$, and $Cs_2CO_3$. The metal quinolate can be a lithium quinolate (Liq) and the metal carbonate can be $Cs_2CO_3$ and the metal fluoride can be one of BaF, LiF, and CsF.

A second hole transport layer HTL-2 is formed on the charge generation layer CGL. The second hole transport layer HTL-2 can be a α-NDP layer and can have a thickness of approximately 30 nm. A second blue light emitting layer B-2 is formed on the second hole transport layer HTL-2. The second blue light emitting layer B-2 can be identical to the first blue light emitting layer B-1. A red light emitting layer R is formed on the second blue light emitting layer B-2. The red light emitting layer R can have a thickness of approximately 10 nm, and can include $Alq_3$ as an organic host and DCJTB as a light emitting dopant. The content of the DCJTB in the red light emitting layer R can be approximately 2 wt %. The dopants included in the red light emitting layer R, the green light emitting layer G, and the first and second blue light emitting layers B-1 and B-2 are organic molecules or organometal complexes having fluorescence or phosphorescence characteristics.

A second electron transport layer ETL-2 is formed on the red light emitting layer R. The second electron transport layer ETL-2 can be identical to the first electron transport layer ETL-1. An electron injection layer EIL is formed on the second electron transport layer ETL-2. The electron injection layer EIL can have a thickness of approximately 60 nm, and can be formed by doping $Cs_2CO_3$ in BCP coated on the second electron transport layer ETL-2. The electron injection layer EIL is optional. A cathode C is formed on the electron injection layer EIL. The cathode C can be an aluminum layer having a thickness of approximately 100 nm. The cathode C can be made out of a material such as Li, Mg, Ca, Al—Li, Mg—In, Mg—Ag, ITO, or IZO other than Al.

As described above, in the OLED according to the present embodiment, the blue light emitting layer is divided into the first and second blue light emitting layers B-1 and B-2, and the first and second blue light emitting layers B-1 and B-2 are separated by the charge generation layer CGL. The green light emitting layer G and the red light emitting layer R are also separated by the charge generation layer CGL. The charge generation layer CGL acts as an electrode. The light emission efficiency of the OLED according to the present embodiment is determined by the greater current (hereinafter, the first current) from among a current applied to the second blue light emitting layer B-2 and the red light emitting layer R which are formed above the charge generation layer CGL and a current applied to the green light emitting layer G and the first blue light emitting layer B-1 which are formed below the charge generation layer CGL.

Hereinafter, first and second comparative examples, which are comparative to the embodiment of the present invention, will now be described.

FIRST COMPARATIVE EXAMPLE

Figure 2:
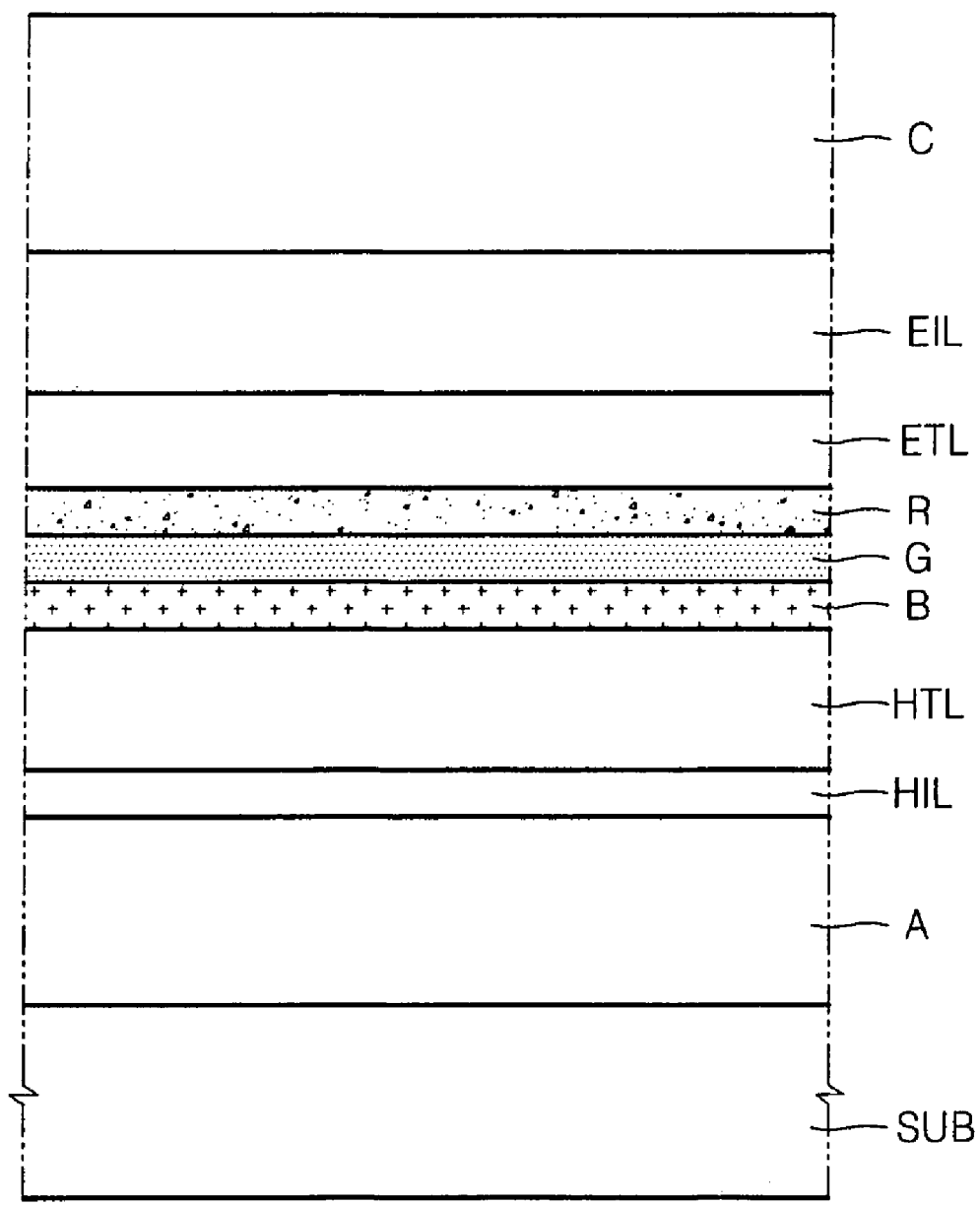
FIGS. 2 and 3 respectively are cross-sectional views of white OLEDs according to first and second comparative examples.

FIG. 2 is a cross-sectional view of a white OLED according to the first comparative example. In FIGS. 1 and 2, like reference numerals are used for like elements. Unlike the white OLED of FIG. 1, in the white OLED of FIG. 2, a blue light emitting layer B, a green light emitting layer G, and a red light emitting layer R are sequentially stacked without a charge generation layer CGL, a first electron transport layer ETL-1, and a second hole transport layer HTL-2. The light emission efficiency of the white OLED according to the first comparative example is determined by a sum of currents (hereinafter, the second current) applied to the blue light emitting layer B, the green light emitting layer G, and the red light emitting layer R. The second current is greater than the first current. Thus, the white OLED that includes the charge generation layer CGL has a light emission efficiency higher than the white OLED that does not include the charge generation layer CGL.

SECOND COMPARATIVE EXAMPLE

Figure 3:
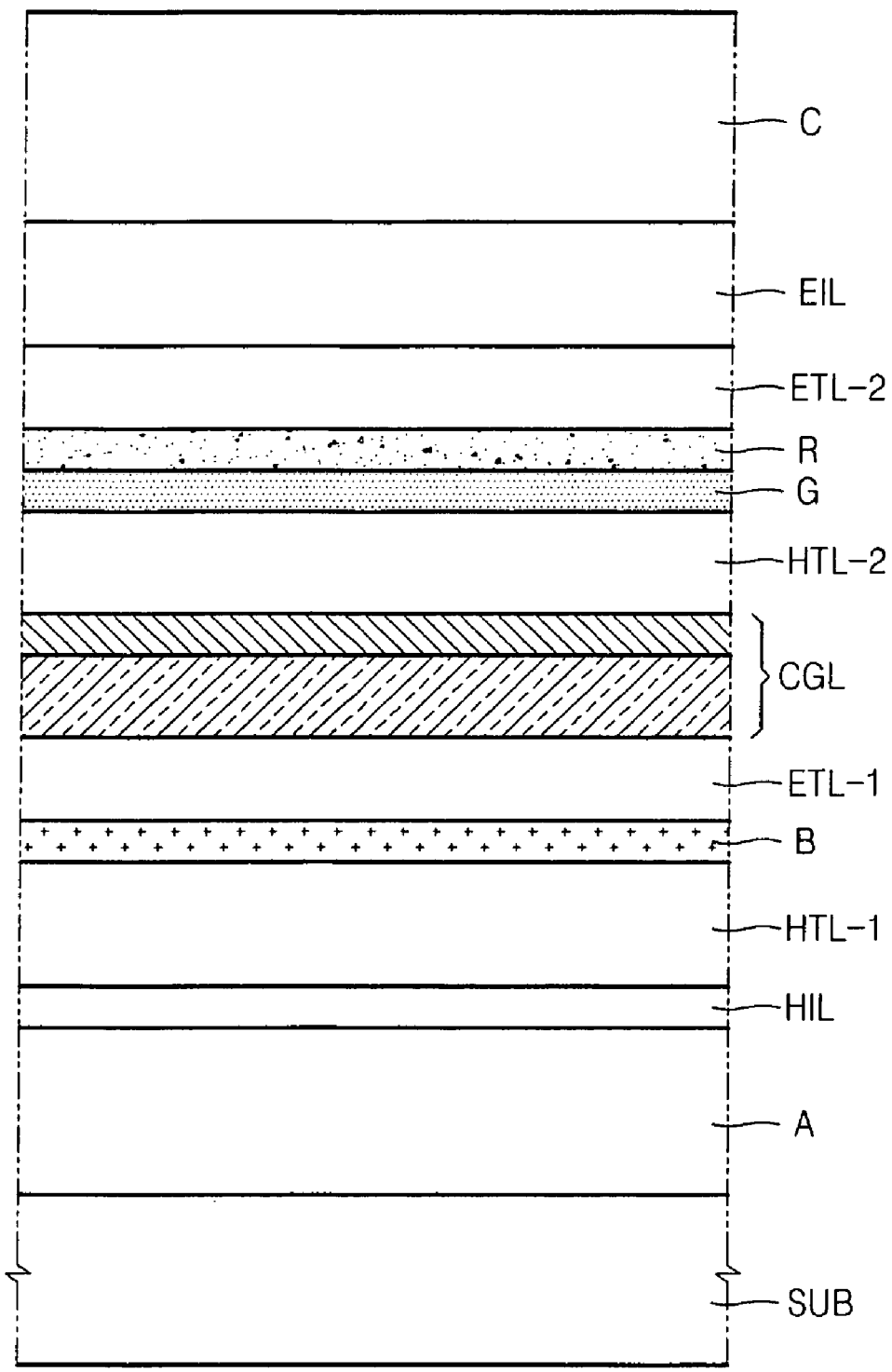

FIG. 3 is a cross-sectional view of a white OLED according to the second comparative example which is compared to the embodiment of the present invention. In FIGS. 1 through 3, like reference numerals are used for like elements.

Like the white OLED of FIG. 1, in the white OLED of FIG. 3, a charge generation layer CGL is present, however the blue light emitting layer B is not divided into first and second blue light emitting layers B-1 and B-2. The blue light emitting layer B, a first electron transport layer ETL-1, the charge generation layer CGL, a second hole transport layer HTL-2, a green light emitting layer G, and a red light emitting layer R are sequentially formed. The light emission efficiency of the white OLED according to the second comparative example is determined by a current (hereinafter, the third current), wherein the current is the greater current among a current applied to the blue light emitting layer B which is present below the charge generation layer CGL and a current applied to the green light emitting layer G and the red light emitting layer R which are present above the charge generation layer CGL. Since the first and second blue light emitting layers B-1 and B-2 are separated by the charge generation layer CGL in FIG. 1, the current applied to the first and second blue light emitting layers B-1 and B-2 is half of the current applied to the blue light emitting layer B of FIG. 3. Therefore, the third current is greater than the first current. This denotes that the light emission efficiency of the white OLED according to the present embodiment is higher than that of the white OLED according to the second comparative example.

In the white OLEDs according to the first and second comparative examples, when a predetermined voltage is applied to the anode A and the cathode C, the current that is applied to the blue light emitting layer B is the largest among the currents applied to the blue light emitting layer B, the green light emitting layer G, and the red light emitting layer R. Therefore, in the second comparative example, the blue light emitting layer B is formed below the charge generation layer CGL, and the green light emitting layer G and the red light emitting layer R are formed above the charge generation layer CGL. In the present embodiment, the blue light emitting layer B is divided into two layers, but the green light emitting layer G is not divided and the red light emitting layer R is also not divided. In other words, when currents are applied to the green light emitting layer G, the first and second blue light emitting layers B-1 and B-2, and the red light emitting layer R respectively by a voltage applied between the anode A and the cathode C, the sum of currents applied to the first and second blue light emitting layers B-1 and B-2 can be greater than the current applied to the green light emitting layer G or the red light emitting layer R. In the first and second comparative examples, if the blue light emitting layer B, the green light emitting layer G, and the red light emitting layer R are made out of different materials, the light emitting layer to which the largest current is applied can be the green light emitting layer G or the red light emitting layer R instead of the blue light emitting layer B. Thus, the light emitting layer that is divided into two layers can be the green light emitting layer G or the red light emitting layer R instead of the blue light emitting layer B.

Table 1 summarizes the measurement results of current efficiency and color coordinates with respect to the white OLEDs according to the embodiment of the present invention and the first and second comparative examples. The current efficiency results in Table 1 were measured at a brightness of 1000 nit ($cd/m^2$) and the color coordinates were measured at a current of 1 mA.

TABLE 1

| Item | Current efficiency (cd/A) @ 1000 nit (maximum current efficiency) | Color coordinates(x, y) @ 1 mA |
|---|---|---|
| Present embodiment | 9.15 (10.27) | (0.28, 0.30) |
| First comparative | 6.14 (6.33) | (0.32, 0.37) |
| Second comparative | 7.38 (8.13) | (0.27, 0.32) |

Figure 4:
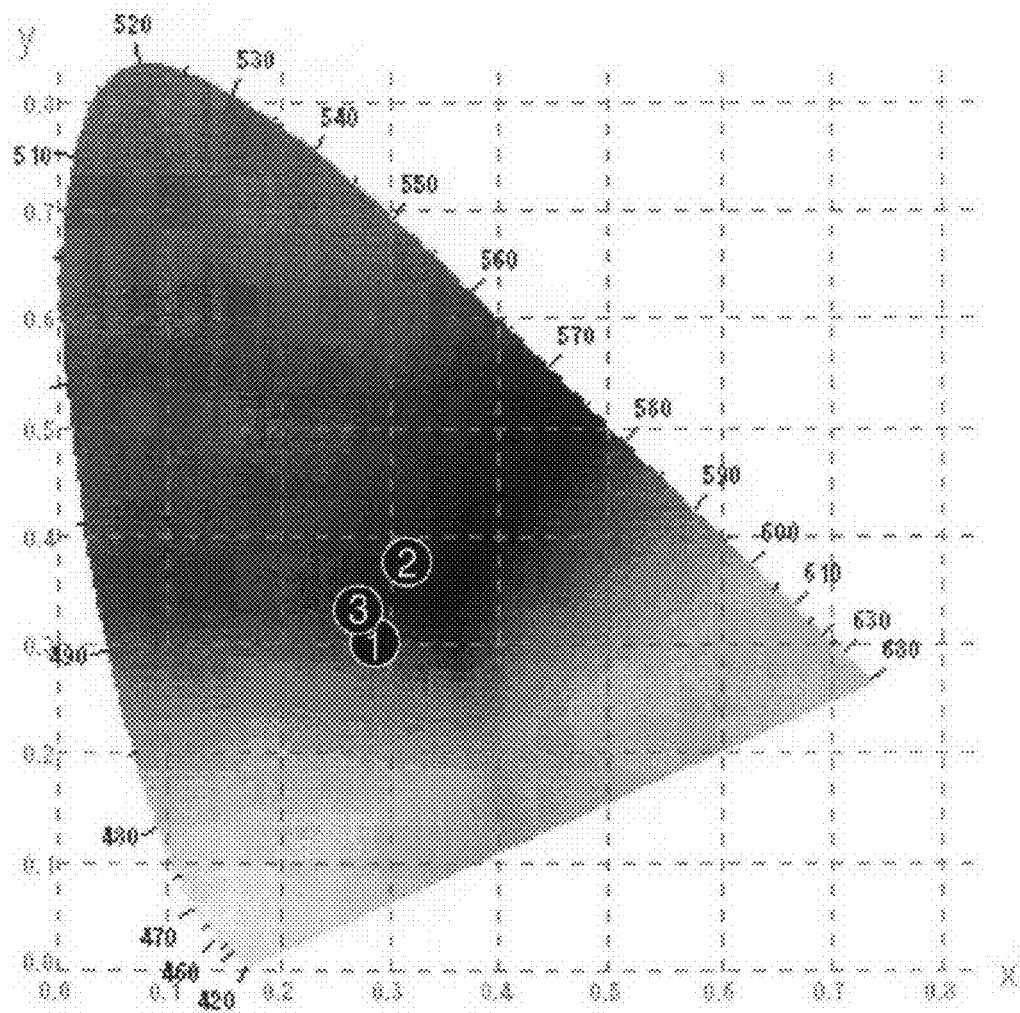
FIG. 4 is a graph showing color coordinates of each of the white OLEDs according to an embodiment of the present invention, and the first and second comparative examples.

FIG. 4 is a graph showing color coordinates with respect to the white OLEDs according to the embodiment of the present invention and the first and second comparative examples. In FIG. 4, ①, ② and ③ indicate the color coordinates according to an embodiment of the present invention and the first and second comparative examples, respectively.

Referring to the current efficiency data in Table 1, the current efficiency of the white OLED according to an embodiment of the present invention is 9.15 cd/A at 1000 nit, which is higher than that of the white OLED according to the first and second comparative examples.

Referring to the color coordinate data in Table 1 and FIG. 4, the color coordinates of the white OLED according to an embodiment of the present invention is (0.28, 0.30), which is closer to the color coordinates (0.31, 0.31) than the color coordinates of the white OLEDs according to the first and second comparative examples. Considering that generally, the closer the color coordinates are to the color coordinates (0.31, 0.31), the closer the light is to pure white, this demonstrates that the white OLED according to the present embodiment has light emitting characteristics superior to the white OLEDs according to the first and second comparative examples.

As described above, in the white OLED according to the present invention, one of the blue, green, and red light emitting layers is divided into first and second layers, and a charge generation layer is formed between the first and second light emitting layers. The two light emitting layers that are not divided into the first and second light emitting layers are also separated by the charge generation layer. In this way, the magnitude of current that determines the light emission efficiency can be reduced. Thus, the use of the present invention can realize a white OLED having a reduced driving voltage and increased light emission efficiency.

While the present invention has been shown and described with reference to embodiments thereof, it should not be construed as being limited to such embodiments. Those skilled in this art know, for example, the anode A, the hole injection layer HIL, the first and second hole transport layers HTL-1 and HTL-2, the first and second electron transport layers ETL-1 and ETL-2, the electron injection layer EIL, and the cathode C of the present invention can be made out of different materials. Also, another electron injection layer, another hole injection layer, and/or a hole blocking layer can be formed in a predetermined location between the anode A and the cathode C. For example, an electron injection layer may be arranged between the charge generation layer CGL and the first electron transport layer ETL-1. Also, a hole injection layer may be arranged between the second hole transport layer HTL-2 and the charge generation layer CGL. Therefore, the scope of the invention is not defined by the detailed description of the invention but by the appended claims.

What is claimed is:

1. A white organic light emitting device, comprising:
an anode;
a cathode;
a charge generation layer arranged between the anode and the cathode; and
an organic layer arrangement arranged between the anode and the cathode, the organic layer arrangement including a green light emitting layer, a blue light emitting layer, and a red light emitting layer, one of the green light emitting layer, the blue light emitting layer, and the red light emitting layer includes a first light emitting layer and second light emitting layer, the charge generation layer being arranged between the first light emitting layer and the second light emitting layer, wherein other ones of the green light emitting layer, the blue light emitting layer, and the red light emitting layer consist of only a single light emitting layer, and wherein ones of the other ones of the green light emitting layer, the blue light emitting layer and the red light emitting layer are separated from each other by at least the charge generation layer.

2. The white organic light emitting device of claim 1, wherein other ones of the green light emitting layer, the blue light emitting layer, and the red light emitting layer includes single light emitting layers, and wherein a sum of currents applied to the first and second light emitting layers is greater than a current applied to each of the single light emitting layers upon application of current to the organic layer arrangement upon application of a voltage between the anode and the cathode.

3. The white organic light emitting device of claim 1, further comprising a first electron transport layer arranged between a layer of said organic layer arrangement and the charge generation layer, the first electron transport layer also being arranged between the anode and the charge generation layer.

4. The white organic light emitting device of claim 1, further comprising a hole transport layer arranged between a layer of said organic layer arrangement and the charge generation layer, the hole transport layer also being arranged between the cathode and the charge generation layer.

5. The white organic light emitting device of claim 4, further comprising a hole injection layer arranged between the hole transport layer and the charge generation layer.

6. The white organic light emitting device of claim 1, wherein the charge generation layer comprises at least one material selected from a group consisting of an organic compound of aryl amine group, a metal, a metal quinolate, a metal oxide, a metal carbonate, and a metal fluoride.

7. The white organic light emitting device of claim 1, wherein the charge generation layer comprises at least one layer.

8. The white organic light emitting device of claim 6, wherein the organic compound of the aryl amine group is an element selected from a group consisting of α-NPD, BCP, 2-TNATA, TDATA, m-MTDATA, spiro-TAD, and sprio-NPB.

9. The white organic light emitting device of claim 6, wherein the metal is an element selected from a group consisting of Cs, Mo, V, Ti, W, Ba, and Li.

10. The white organic light emitting device of claim 6, wherein the metal quinolate comprises lithium quinolate (Liq).

11. The white organic light emitting device of claim 6, wherein the metal oxide is an element selected from a group consisting of $Re_2O_7$, $MoO_3$, $V_2O_5$, $WO_3$, $TiO_2$, and $Cs_2CO_3$.

12. The white organic light emitting device of claim 6, wherein the metal carbonate comprises $Cs_2CO_3$.

13. The white organic light emitting device of claim 6, wherein the metal fluoride is an element selected from a group consisting of BaF, LiF, and CsF.

14. The white organic light emitting device of claim 1, further comprising a hole transport layer arranged between the anode and the organic layer arrangement.

15. The white organic light emitting device of claim 14, further comprising a hole injection layer arranged between the anode and the hole transport layer.

16. The white organic light emitting device of claim 1, further comprising an electron transport layer arranged between the cathode and the organic layer arrangement.

17. The white organic light emitting device of claim 16, further comprising an electron injection layer arranged between the cathode and the electron transport layer.

18. The white organic light emitting device of claim 1, wherein each of the green light emitting layer, the blue light emitting layer, and the red light emitting layer comprises a host and a dopant selected from a group consisting of a fluorescent dopant and a phosphorescent dopant.

19. The white organic light emitting device of claim 18, wherein the green light emitting layer comprises $Alq_3$ as the host and Coumarin6 as a dopant.

20. The white organic light emitting device of claim 18, wherein the blue light emitting layer comprises TBADN as the host and DPAVBi as the dopant.

21. The white organic light emitting device of claim 18, wherein the red light emitting layer comprises $Alq_3$ as the host and DCJTB as the dopant.

22. The white organic light emitting device of claim 1, wherein the green light emitting layer, the blue light emitting layer, and the red light emitting layer are sequentially arranged on the anode.

23. The white organic light emitting device of claim 22, said one of the green light emitting layer, the blue light emitting layer, and the red light emitting layer is the blue light emitting layer.

24. A white organic light emitting device, comprising:
an anode;
a cathode;
a charge generation layer arranged between the anode and the cathode; and
an organic layer arrangement including a first light emitting layer of a first color, a second light emitting layer of the first color, a first and only light emitting layer of a second color and a first and only light emitting layer of a third color stacked on each other, each of the first color, the second color and the third color being different from each other and each being selected from a group consisting of blue, green and red, wherein both the first light emitting layer of the first color and the light emitting layer of the second color are arranged between the charge generation layer and the cathode, and wherein both the second light emitting layer of the first color and the light emitting layer of the third color are arranged between the charge generation layer and the anode.

25. The white organic light emitting device of claim 24, the first color being blue.

* * * * *